United States Patent
Goland et al.

(10) Patent No.: US 6,352,014 B1
(45) Date of Patent: Mar. 5, 2002

(54) METHOD FOR MAKING PUNCHES USING MULTI-LAYER CERAMIC TECHNOLOGY

(75) Inventors: David B. Goland, New Paltz; David C. Long, Wappinger Falls; John U. Knickerbocker, Hopewell Junction; Subhash L. Shinde, Cortland Manor, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/464,510

(22) Filed: Dec. 15, 1999

(51) Int. Cl.⁷ ............................. B26F 1/14; B28B 1/14
(52) U.S. Cl. ..................... 83/684; 264/642; 419/37
(58) Field of Search ..................... 29/401.1, 419.2; 419/36, 37; 83/384; 76/107.1; 264/642

(56) References Cited

U.S. PATENT DOCUMENTS

| | | | |
|---|---|---|---|
| 3,948,706 A | * | 4/1976 | Schmeckenbecher |
| 4,024,629 A | * | 5/1977 | Lemoine et al. |
| 4,599,277 A | * | 7/1986 | Brownlow et al. |
| 4,721,599 A | * | 1/1988 | Nakamura |
| 5,011,725 A | | 4/1991 | Foster |
| 5,067,979 A | * | 11/1991 | Kiyota et al. |
| 5,271,150 A | | 12/1993 | Inasaka |
| 5,530,081 A | | 6/1996 | Nover |
| 5,603,071 A | * | 2/1997 | Kitagawa et al. |
| 5,759,669 A | | 6/1998 | Casey |
| 5,779,833 A | | 7/1998 | Cawley |
| 5,876,536 A | * | 3/1999 | Kumar et al. |
| 6,146,697 A | * | 11/2000 | Undercoffer |
| 6,171,360 B1 | * | 1/2001 | Suzuki et al. |

* cited by examiner

Primary Examiner—M. Rachuba
Assistant Examiner—Thomas J Druan, Jr.
(74) Attorney, Agent, or Firm—Margaret A. Pepper

(57) ABSTRACT

A method for making small punches by employing multi-layer ceramic (MLC) technology includes the steps of preparing a sublaminate matrix of a high or low sintering temperature material, drilling holes in the sublaminate using a mask as a guide, filling the holes with punch material paste by a solupor process, laminating the sublaminate to a base plate or as a freestanding substrate, firing a laminate at an appropriate sintering temperature and removing the matrix material by a chemical or mechanical method. In accordance with the present invention, a large number of small punches are made in parallel to precise dimensions of two to ten mils in diameter and approximately 100 mils in length. This method allows that a punch plate array can also be used to simultaneously punch an array of vias in a greensheet and eliminates the additional step of loading individual punches into a punch plate, offering cost and time savings.

42 Claims, 4 Drawing Sheets

METHOD FOR MAKING PUNCHES USING MULTI-LAYER CERAMIC TECHNOLOGY

FIELD OF INVENTION

The present invention relates to a method for making punches and more particularly to a method of making sintered carbide punches using multi layer ceramic technology.

BACKGROUND OF THE INVENTION

Multi-layer ceramic technology is used in the present invention for making punches for semiconductor packaging.

Various techniques have been employed for forming a multi layer substrate. For example, U.S. Pat. No. 5,779,833 describes a method for manufacturing an integral three dimensional object from laminations, including the steps of fabricating a plurality of greensheet layers and firing the same to remove binder material.

For the substrate structure, U.S. Pat. No. 5,011,725 discloses substrates with dense material vias derived from a metallization composition, wherein plated through holes are made in ceramic substrates. The holes are infiltrated with another metal for strength. In particular, U.S. Pat. No. 5,530,081 describes a plastic material composed of silicon carbide, polycarbosilane and organic solvent and the use of ceramic carbide material for forming a molded object.

The present invention provides a method for making carbide punches using multi-layer ceramic (MLC) technology, comprising the steps of preparing a sublaminate of greensheets, patterning through-holes by drilling out the holes, filling the holes with a carbide material, sintering the same at high temperature and removing non-carbide material to produce punches.

In a conventional method of fabricating a ceramic multi layer substrate by greensheet fabrication technology, a ceramic slurry is cast on a carrier film and the resulting ceramic greensheet is separated from the carrier film followed by subsequent fabrication processes. Further, the ceramic greensheets tend to be deformed during the process of punching holes and the process of filling with paste, resulting in misalignment of the holes in a stack of the greensheet U.S. Pat. No. 5,271,150 has been suggested to relieve the above-mentioned problem and is directed to a method of forming a ceramic multi layer substrate, wherein an organic film is bonded on a greensheet. Through-holes are formed on the greensheet and filled with conductive paste. One of the films is removed and a laminate assembly is formed. However, none of the conventional techniques describe a method for making small punches at low cost by utilizing multi layer ceramic (MLC) technology.

SUMMARY OF THE INVENTION

It is therefore an object of the present invention to provide a method for making small punches using multi-layer ceramic (MLC) fabrication technology. The punches made according to the present invention have dimensions of two (2) to ten (10) mils in diameter and approximately hundred (100) mils in lengths. The small punches of the present invention are used for fabricating semiconductor packaging. The alternative at present is tungsten carbide cermet punch which is precision ground from 125 mil diameter stock and is costly, whereas the cost of manufacturing a punch according to the invention, is at least an order of magnitude less.

Another object of the present invention is to provide a method for making a punch array in a single step. This can be achieved by simultaneously sintering punches while they are in intimate contact with a base plate. This array can subsequently be used to punch an array of vias in a greensheet. The present invention therefore eliminates the additional step of loading individual punches into a punch head. Accordingly, the present invention offers both cost and time savings.

A further object of the present invention is to provide a large number of small punches made in parallel to precise dimensions by utilizing MLC technology.

These and other objects of the present invention, which shall become herein apparent, are achieved by a method of making punches using multi-layer ceramic technology, comprising the steps of:

(a) preparing a sublaminate matrix or a single thick green sheet of a high or low sintering temperature material;

(b) drilling holes in the sublaminate optionally using a mask as a guide;

(c) filling the holes with punch material paste utilizing the solupor process or a process that ensures complete via fill and produces a flush surface after paste drying;

(d) laminating the sublaminate to a base plate or as a freestanding substrate;

(e) firing a laminate at an appropriate sintering temperature; and (f) removing the matrix material by a chemical or mechanical method.

Instead of a sublaminate in process (a), alternatively a single thick green sheet can also be used. Further, the flush surface in the filling process (c) does not have any depression or dimples.

BRIEF DESCRIPTION OF THE DRAWINGS

The above and other objects and features of the present invention will become apparent from the following description of preferred embodiments in conjunction with the accompanying drawings, in which.

DETAILED DESCRIPTION OF THE PREFERRED EMBODIMENTS

Referring to FIGS. 1 to 6, a method for making small punches by utilizing MLC technology according to the present invention is depicted. The method for making small punches of the present invention is initiated with the preparation of a sublaminate of green or unfired sintering material and followed by drilling holes in the sublaminate, filling the holes with punch material, laminating the sublaminate, firing a laminate and removing the matrix material.

Figure 1:
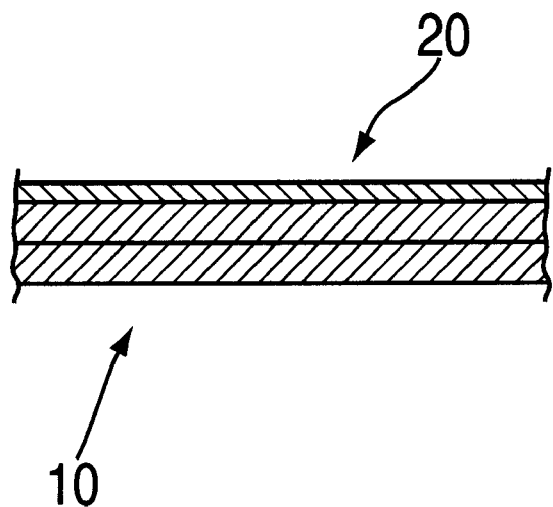
FIG. 1 is a sectional view showing a ceramic greensheet sublaminate and mask.
Figure 2:
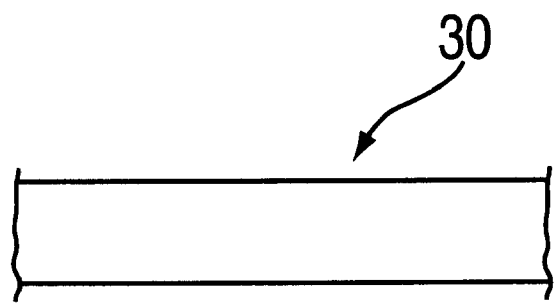
FIG. 2 is a sectional view of a base plate.

In detail, FIG. 1 shows a sublaminate 10 of a ceramic greensheet. A ceramic powder is mixed with an organic binder, and then cast to produce the greensheet. The greensheet comprises either a high or a low sintering temperature material, binder and plasticizer. Specifically, the greensheet is prepared from a material of high sintering temperature above 1600° C. or a material of low sintering temperature below 1000° C. The sintering material forms a matrix phase, within which the punches are contained. One of the properties of this material is that it can be removed selectively after the sintering process or it can vaporize during the thermal process. Examples of the high temperature sintering materials include aluminum nitride, alumina, zirconia, yttria, etc. Those of low temperature sintering and/or vaporizing materials include carbon, magnesium oxide, boron oxide, etc. In a preferred embodiment of the present invention, the sublaminate is prepared from aluminum nitride, which has a sintering temperature of about 1850° C. The aluminum nitride can be easily removed by a strong base after the carbide sintering process. The examples of the strong base include sodium hydroxide (NaOH), and potassium hydroxide (KOH).

Figure 3A:
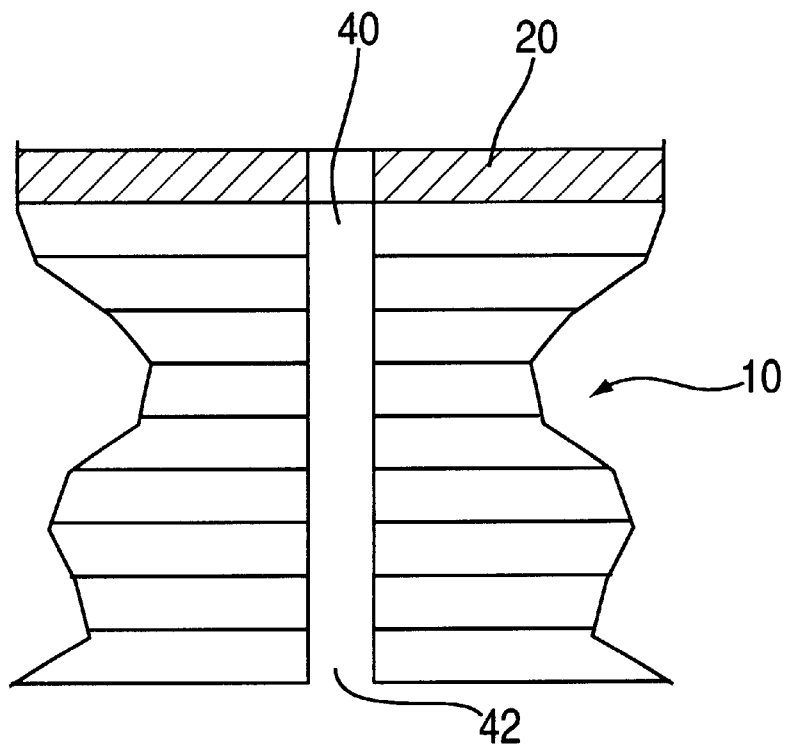
FIG. 3A is a sectional view illustrating a part of the inventive process in which holes are formed through the sublaminate.
Figure 3B:
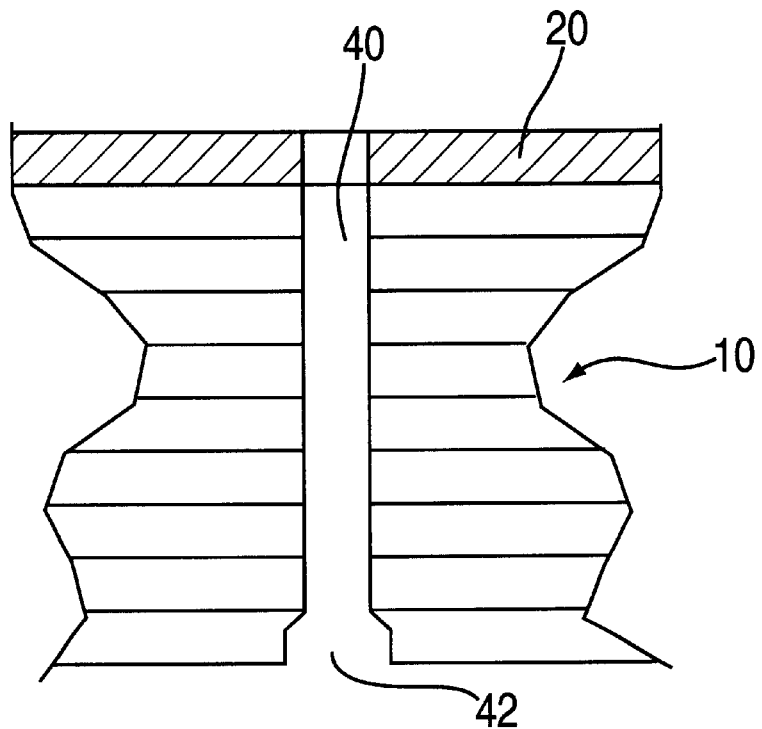
FIG. 3B is a sectional view illustrating the method to create an alternative punch shape that improves the strength and bonding strength to punch plate.
Figure 3C:
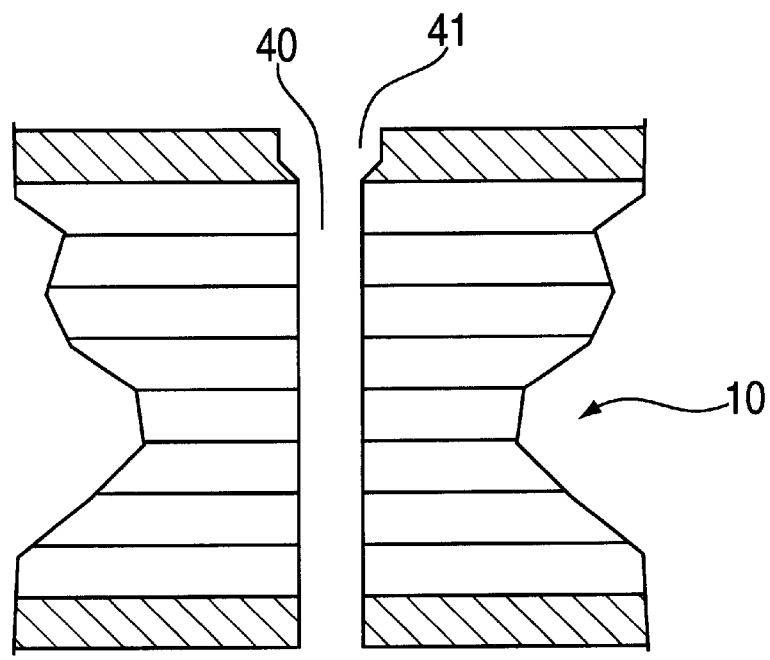
FIG. 3C is a sectional view illustrating the method to make headed punches, using two different diameter drills.

Secondly, holes 40 are drilled in the green sublaminate 10 optionally using the mask 20 as a guide. FIGS. 3A to 3C are sectional views illustrating states in which holes 40 are formed through the sublaminate 10. The holes can be drilled using a variety of methods, including mechanical, e-beam or laser drilling method. The mechanical, e-beam and laser drilling methods according to the conventional techniques are well known in the art. On the other hand, a conventional punching method uses a metal rod or a punch which pierces a greensheet to make a hole. According to the conventional method, where holes are punched in a single greensheet and then stacked, there is some misalignment of the holes in a stack of the greensheets. Thus this process is unsuitable for fabricating punches.

However, instead of punching a hole in a single greensheet, the present invention uses a method of laminating a number of greensheets together at low pressure, creating a sublaminate. The object of forming the sublaminate is to make a structure that is relatively thick and in which the sheets can be drilled with holes and filled with a punch paste material. The greensheet material is somewhat tacky when heated. According to the present invention, a low pressure of about 100–1,000 psi is used to minimize the compression of the stack. The reason for using this method is to provide the maximum thickness of matrix material for a subsequent step of filling vias, which, in turn, maximizes the initial volume of paste material in the vias.

Further, in a preferred embodiment of the present invention, a metal mask 20 is included in the sublaminate 10. The metal mask is made of molybdenum, tungsten or stainless steel. A preferred mask is made of molybdenum. The purpose of using the mask is to provide a guide template for a drill to form holes in the sublaminate. When a drill comes down and is slightly off, the mask guides the drill into the sublaminate in the right location. When a laser is used for drilling holes, the mask may or may not be necessary.

When a punch paste is screened into the holes in the following step, the mask also functions as a guide for screening, depending on the size of the holes filled. In accordance with the present invention, the holes have dimensions of 0.002 in. (2 mils) to 0.010 in. (10 mils) in diameter and 0.100 in. (100 mils) in length. The length is adjusted by the number of greensheets used in the sublaminate. With the larger diameters, it is fairly easy to fill the holes without a mask. With the smaller diameters, however, there is excess material on the surface of the holes filled. Using a mask as a guide for screening facilitates via fill without leaving excess paste material on the surface of the sublaminate. Further, the mask reduces the sublaminate distortion resulting from interaction between the green sheet and paste organics, both by reducing the amount of paste on the top surface and by mechanically constraining the sublaminate.

As seen in FIGS. 3A to 3C, after drilling small hole, a larger hole is drilled to form head 41 or to provide larger and stronger bonding area 42 to base plate 30.

Figure 4:
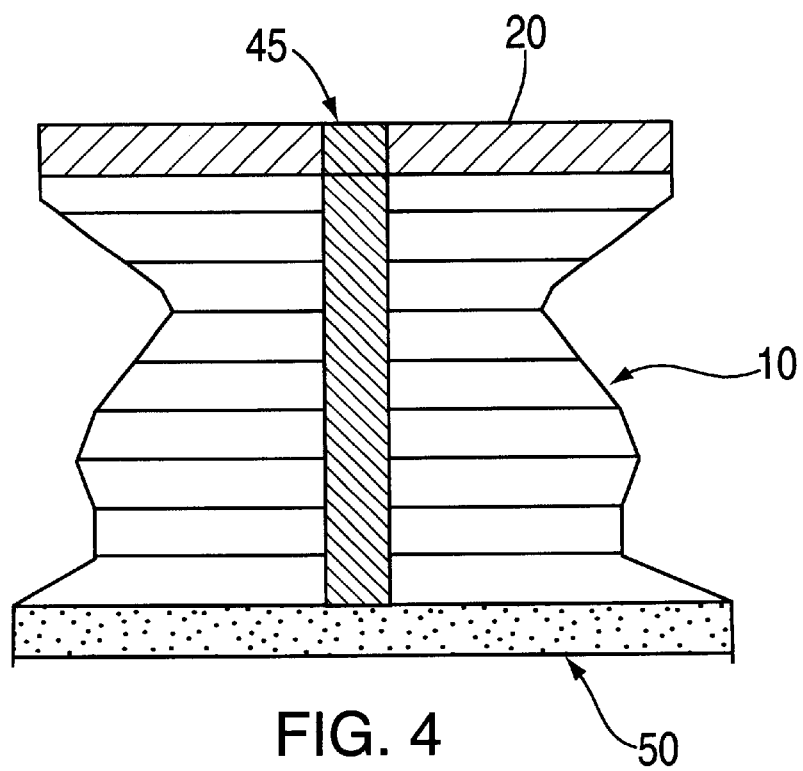
FIG. 4 is a sectional view of a part of the inventive process in which the holes are filled with punch material pastes.
Figure 5:
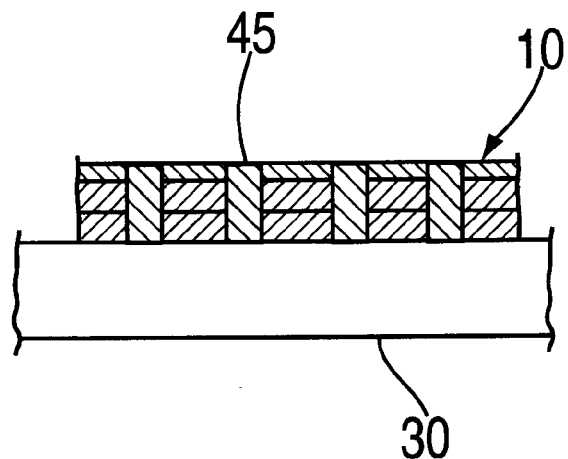
FIG. 5 is a sectional view showing a part of the inventive process in which the sublaminate is laminated to the base plate.

After the holes are formed, they are filled using a process that results in a flush via surface after drying. FIG. 4 depicts a sectional view of the step in which punch material paste is filled in the holes by multipass silkscreen type screening, thereby forming paste-filled holes 45. The technique described in U.S. Pat. No. 5,759,669 is a preferred filling process. The filling process is conducted by using an organic binder paste and solvent with a metal powder mixed therein. The filling materials used in the present invention include nickel, tungsten carbide containing cermets (WC/Co), titanium, vanadium, zirconium or similar transition metal carbides and sintering aids or other hard materials. In a preferred embodiment of the present invention, the punch material is made of WC with Co. The organic binder such as ethyl cellulose dissolves in the solvent including methanol and MIBK (methyl iso-butyl ketone). Solupor is a porous plastic material described in U.S. Pat. No. 5,759,669. During the screening process, the sublaminates are put on the top of the solupor 50 and the holes 40 are filled with the paste down to the bottom. The filling process used in the present invention enables via fill that is flush with the surface of greensheet. The purpose for having the flush surface is to optimize the contact between the punch and the base plate in order to ensure that they sinter and bond together in the subsequent processing. The method of making small punches of the present invention may further include the step of laminating the substrate either as a free standing substrate or to a base plate 30. FIG. 5 is a sectional view depicting a state wherein the sublaminate 10 is laminated to the base plate shown in FIG. 2.

The base plate comprises molybdenum, nickel, tungsten, cobalt or a baseplate of any of these materials with a thin layer of adhesion promotor materials such as Cr, Ti, Ni, Co etc. The adhesion layer could be patterned using silk screening. In a preferred embodiment of the present invention, the base plate is made of molybdenum. In accordance with the present invention, the sublaminate is laminated to a base plate by using bonding material such as PMMA (Polymethylmethacrylate) or other low temperature adhesives at a temperature of between 20° C. and 150° C. and under a pressure between 100 and 1000 psi. The resulting structure formed is a punch plate array after subsequent steps of sintering and removing the matrix material. This array can be used to simultaneously punch an array of vias in a greensheet. Further, according to the present invention, the additional step of loading individual punches into a punch plate is eliminated, thereby providing both cost and time savings. Alternatively, by laminating the substrate as a free standing substrate, individual punches are produced after sintering and a subsequent removal of matrix material.

The fully laminated structure is fired at a temperature appropriate to sinter the punch material in a furnace. In the furnace, the organic binder burns off, decomposes, and vaporizes. The ceramic material comprising the greensheets and the metal in the vias coalesce and sinter to form a rigid porous body in the case of ceramic and a dense body in the case of carbide material. According to the present invention, the sintering temperature ranges about from 900° C. to 1850° C. depending on the punch materials. In a preferred embodiment of the present invention, the sintering temperature is 1200° C. for the punch material of nickel, 1375° C. for tungsten carbide (WC) with Co. In a preferred embodiment of the present invention, the punch material is sintered for a period of 1 to 10 hours, preferably 4 hours.

Figure 6:
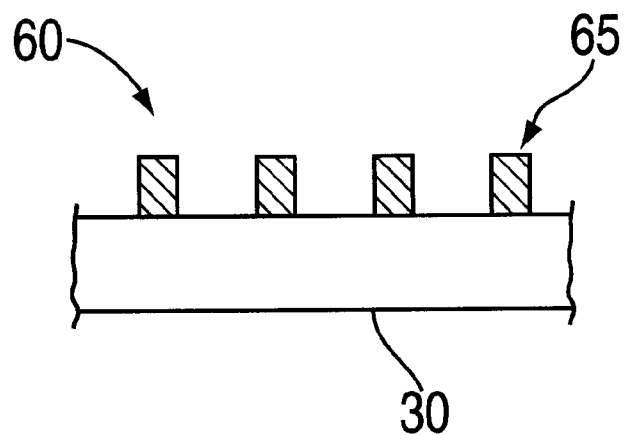
FIG. 6 represents a sectional view of a punch plate array from which the matrix material is removed.

Finally, the matrix material is removed either mechanically or chemically. FIG. 6 represents a sectional view of a punch plate array 60 comprising punches 65, from which the matrix material has been removed. For example, the mechanical method includes water, slurry, sand or steam blasting. The aluminum nitride can be removed by using a strong base such as KOH.

In accordance with the present invention, the final products of small punches are formed as individual punches or a punch plate array. In a preferred embodiment of the present invention, the final product formed is a punch plate array that confers several benefits. One of the advantages according to the present invention is that the array can also be used to simultaneously punch an array of vias in a greensheet. Further, the additional step of loading individual punches into a punch plate is not necessary so that the present invention offers both time and cost savings. Another advantage, according to the present invention, is that this method allows a large number of small punches to be made in parallel to precise dimensions. An additional advantage is that punches can be manufactured using this method at a substantially lower cost than the conventional methods.

The punches once fabricated, whether as individual punches or punch arrays, can then be coated with wear resistant coatings. These coatings comprise TiC, WC, TiCN or diamond, are about 1 to 5 µm in thickness and can be deposited using a number of thin film deposition techniques including CVD (chemical vapor deposition), sputtering, laser ablation, etc.

While the present invention has been described with respect to the particular embodiments, it will be apparent to those skilled in the art that various modifications and changes may be made without departing from the spirit and scope of the invention as defined in the following claims:

1. A method for making punches, comprising the steps of:
   (a) forming a sublaminate comprising a plurality of layers of matrix material;
   (b) forming holes in the sublaminate;
   (c) filling the holes with punch material paste;
   (d) laminating the sublaminate to form a laminate;
   (e) firing the laminate at an appropriate sintering temperature; and
   (f) removing the matrix material from the laminate.

2. The method according to claim 1, wherein the sublaminate comprises a high or low sintering temperature material.

3. The method according to claim 2, wherein the high sintering temperature material is aluminum nitride.

4. The method according to claim 2, wherein the low sintering temperature material is carbon.

5. The method according to claim 1, wherein a mask is included in the sublaminate.

6. The method according to claim 5, wherein the mask comprises molybdenum.

7. The method according to claim 1, wherein the step of forming holes in the sublaminate is done using a mask as a guide.

8. The method according to claim 1, wherein the step of forming holes in the sublaminate is done using a mechanical, e-beam or laser drilling method.

9. The method according to claim 1, wherein the holes in the sublaminate have a diameter of about 0.002 in. to about 0.010 in. and a length of about 0.100 in.

10. The method according to claim 1, wherein, prior to step (c), the sublaminate is placed on a porous plastic material.

11. The method according to claim 1, wherein, in step (c), the holes are filled with nickel, tungsten carbide or other hard materials such as titanium carbide, zirconium carbide, vanadium carbide or other transition metal carbides, or diamond.

12. The method according to claim 1, wherein, in step (d), the sublaminate is laminated to a base plate.

13. The method according to claim 12, wherein the base plate comprises molybdenum.

14. The method according to claim 1, wherein, in step (d), the sublaminate is laminated as a freestanding substrate.

15. The method according to claim 1, wherein, in step (e), the sintering temperature is in the range of about 900 to about 1850° C.

16. The method according to claim 1, wherein, in step (e), the firing is performed for a time in the range of about 1 to about 10 hr.

17. The method according to claim 12, wherein, prior to lamination, an adhesion promoter layer is provided on the base plate.

18. The method according to claim 17, wherein the adhesion promoter layer is provided using silk screening or depositing.

19. A method for making punches, comprising the steps of:
   (a) forming a sublaminate comprising a plurality of layers of matrix material;
   (b) forming holes in the sublaminate;
   (c) filling the holes with punch material paste;
   (d) firing the sublaminate at an appropriate sintering temperature; and
   (e) removing the matrix material from the sublaminate.

20. The method according to claims 1 or 19, wherein the sublaminate is formed by applying low pressure in the range of about 100 psi to about 1000 psi.

21. A method for making punches, comprising the steps of:
   (a) forming a thick greensheet comprising a matrix material;
   (b) forming holes in the greensheet;
   (c) filling the holes with punch material paste;
   (d) laminating the greensheet, thereby forming a laminate;
   (e) firing a laminate at an appropriate sintering temperature; and
   (f) removing the matrix material from the laminate.

22. The method according to claims 1, 19 or 21, wherein the matrix material is removed by a chemical method.

23. The method according to claims 1, 19 or 21, wherein the matrix material is removed by a mechanical method.

24. The method according to claims 1, 19 or 21, wherein the step of forming holes is done using two drills having different diameters.

25. A punch made in accordance with the method of any of claims 1 to 21.

26. The punch according to claim 25, wherein the punch comprises metal carbide or composite materials, has a size of 80 μm or less, and comprises a straight shank, with an upper portion having a first diameter and a lower portion having a second diameter smaller than the first diameter.

27. The punch according to claim 25, wherein an external coating is applied to the punch, comprising a material selected from the group consisting of TiC, WC, TiCN and diamond, to provide greater wear resistance.

28. The method according to claim 1, wherein the sintering temperature is sufficient to densify the punch material and to transform the matrix material to a rigid porous body.

29. The method according to claim 19, wherein the sintering temperature is sufficient to density the punch material and to transform the matrix material to a rigid porous body.

30. The method according to claim 21, wherein the sintering temperature is sufficient to densify the punch material and to transform the matrix material to a rigid porous body.

31. The method according to claim 1, wherein the sintering temperature is sufficient to density the punch material and to vaporize the matrix material.

32. The method according to claim 19, wherein the sintering temperature is sufficient to densify the punch material and to vaporize the matrix material.

33. The method according to claim 21, wherein the sintering temperature is sufficient to densify the punch material and to vaporize the matrix material.

34. The method according to claim 1, wherein the punch material comprises nickel, the matrix material comprises aluminum nitride, and the sintering temperature is about 1200° C.

35. The method according to claim 19, wherein the punch material comprises nickel, the matrix material comprises aluminum nitride, and the sintering temperature is about 1200° C.

36. The method according to claim 21, wherein the punch material comprises nickel, the matrix material comprises aluminum nitride, and the sintering temperature is about 1200° C.

37. The method according to claim 1, wherein the punch material comprises tungsten carbide, the matrix material comprises aluminum nitride, and the sintering temperature is about 1375° C.

38. The method according to claim 19, wherein the punch material comprises tungsten carbide, the matrix material comprises aluminum nitride, and the sintering temperature is about 1375° C.

39. The method according to claim 21, wherein the punch material comprises tungsten carbide, the matrix material comprises aluminum nitride, and the sintering temperature is about 1375° C.

40. The method according to claim 1, wherein the holes are formed using a drilling method.

41. The method according to claim 19, wherein the holes are formed using a drilling method.

42. The method according to claim 21, wherein the holes are formed using a drilling method.

* * * * *